US010236192B2

(12) United States Patent
Nonaka et al.

(10) Patent No.: US 10,236,192 B2
(45) Date of Patent: Mar. 19, 2019

(54) LIQUID PROCESSING APPARATUS, LIQUID PROCESSING METHOD, AND STORAGE MEDIUM

(71) Applicant: Tokyo Electron Limited, Tokyo (JP)

(72) Inventors: Jun Nonaka, Kumamoto (JP); Shogo Mizota, Kumamoto (JP); Tatsuya Nagamatsu, Beaverton, OR (US); Daisuke Saiki, Kumamoto (JP); Kazuhiro Teraoka, Kumamoto (JP); Takashi Yabuta, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 233 days.

(21) Appl. No.: 14/548,453

(22) Filed: Nov. 20, 2014

(65) Prior Publication Data
US 2015/0147888 A1    May 28, 2015

(30) Foreign Application Priority Data

Nov. 25, 2013    (JP) .................................. 2013-243005

(51) Int. Cl.
*H01L 21/67* (2006.01)
(52) U.S. Cl.
CPC ................................ *H01L 21/6708* (2013.01)
(58) Field of Classification Search
None
See application file for complete search history.

(56) References Cited

U.S. PATENT DOCUMENTS

| 6,516,815 B1* | 2/2003 | Stevens ............... H01L 21/6708 134/147 |
| 6,805,769 B2* | 10/2004 | Okuda .................... B08B 3/024 134/113 |
| 8,361,234 B2* | 1/2013 | Izuta ................. H01L 21/67051 118/715 |
| 2002/0060202 A1* | 5/2002 | Fukunaga ................. C23F 1/40 216/88 |

(Continued)

FOREIGN PATENT DOCUMENTS

| JP | 07-245287 A | 9/1995 |
| JP | 11-165114 A | 6/1999 |

(Continued)

OTHER PUBLICATIONS

Machine Generated English Translation of JP11-165114. Published Jun. 22,1999.*

(Continued)

*Primary Examiner* — Sylvia MacArthur
(74) *Attorney, Agent, or Firm* — Abelman, Frayne & Schwab

(57) ABSTRACT

A liquid processing apparatus of the present disclosure holds and rotate a substrate in a substrate holding unit, ejects an etching liquid while moving a main nozzle of a main nozzle unit between a first position where the etching liquid reaches a center of the substrate and a second position closer to a peripheral side of the substrate than the first position, and then, ejects the etching liquid to the substrate from a sub nozzle provided at a third position closer to the peripheral side of the substrate than the first position at an ejection flow rate higher than that from the main nozzle.

11 Claims, 6 Drawing Sheets

(56) References Cited

U.S. PATENT DOCUMENTS

| | | | |
|---|---|---|---|
| 2007/0131256 A1* | 6/2007 | Nanba | B08B 3/02 134/33 |
| 2007/0231483 A1* | 10/2007 | Nanba | H01L 21/31055 427/240 |
| 2008/0226830 A1* | 9/2008 | Miyagi | G03F 7/168 427/402 |
| 2009/0004876 A1* | 1/2009 | Koyata | H01L 21/02019 438/753 |
| 2009/0107519 A1* | 4/2009 | Ishikawa | B08B 7/0042 134/1.3 |
| 2009/0214985 A1* | 8/2009 | Kulp | G03F 7/40 430/322 |
| 2009/0229641 A1* | 9/2009 | Yoshida | B08B 3/00 134/107 |
| 2009/0241995 A1* | 10/2009 | Somervell | G03F 7/42 134/30 |
| 2009/0250079 A1* | 10/2009 | Yoshihara | B08B 3/024 134/4 |
| 2010/0154837 A1* | 6/2010 | Ogawa | B08B 3/02 134/32 |
| 2013/0156948 A1* | 6/2013 | Amano | H01L 21/67051 427/240 |
| 2014/0051259 A1* | 2/2014 | Shibayama | H01L 21/30604 438/748 |
| 2014/0197129 A1* | 7/2014 | Fujii | B08B 3/024 216/2 |
| 2015/0147888 A1* | 5/2015 | Nonaka | H01L 21/6708 438/748 |

FOREIGN PATENT DOCUMENTS

| | | | |
|---|---|---|---|
| JP | 11165114 A | * | 6/1999 |
| JP | 2006-093497 A | | 4/2006 |
| JP | 2006093497 A | * | 4/2006 |
| JP | 2007-088755 A | | 8/2007 |
| JP | 2008-218545 A | | 9/2008 |
| JP | 2009-071267 A | | 4/2009 |
| JP | 4974904 B2 | | 7/2012 |
| JP | 2013-010994 A | | 1/2013 |

OTHER PUBLICATIONS

Machine Generated English Translation of JP2006-93497. Published Jun. 4, 2006.*

* cited by examiner

LIQUID PROCESSING APPARATUS, LIQUID PROCESSING METHOD, AND STORAGE MEDIUM

CROSS-REFERENCE TO RELATED APPLICATIONS

This application is based on and claims priority from Japanese Patent Application No. 2013-243005, filed on Nov. 25, 2013 with the Japan Patent Office, the disclosure of which is incorporated herein in its entirety by reference.

TECHNICAL FIELD

The present disclosure relates to a technique for performing a liquid processing on a substrate held on a substrate holding unit by supplying a processing liquid from a nozzle while rotating the substrate.

BACKGROUND

As liquid processings on a semi-conductor substrate, for example, an etching processing by supplying an etching liquid, a cleaning processing by supplying a cleaning liquid, and a processing of forming a coating film by supplying a plating liquid or a liquid including a precursor of an insulating film, are known in the related art. As a method of performing such a liquid processing, a method is known, in which a substrate is held and rotated by a substrate holding unit, and a processing liquid is supplied to a central portion of the substrate from a nozzle such that the processing liquid is spread to an entire surface of the substrate by a centrifugal force.

Depending on the type of the liquid processing, the processing result is affected by a temperature distribution on a surface of the substrate. For example, in a case of an etching processing, an in-plane etching rate of the surface of the substrate may become non-uniform due to the temperature distribution, which in turn causes a decrease in yield of devices. Therefore, what is desired is a technology of enhancing in-plane uniformity of the temperature distribution of the substrate when supplying the processing liquid to the substrate from the nozzle.

Japanese Patent Laid-Open Publication No. 2013-10994 discloses a method of supplying a plating liquid to a rotating substrate, in which a first nozzle and a second nozzle passing a position closer to the center portion of the substrate than the first nozzle are used, and the temperature of the plating liquid ejected from the first nozzle is set to be higher than the temperature of the plating liquid from the second nozzle (see, e.g., paragraphs 0010 and 0112, and FIG. 17). However, this method is insufficient in a case where considerably high uniformity is required for an in-plane temperature distribution of the substrate.

SUMMARY

A liquid processing apparatus of the present disclosure includes a substrate holding unit configured to hold a substrate horizontally; a rotating mechanism configured to rotate the substrate holding unit around a vertical axis; a main nozzle configured to eject a processing liquid onto a surface of the substrate held in the substrate holding unit; a nozzle moving mechanism configured to reciprocate the main nozzle between a first position where the processing liquid ejected from the main nozzle reaches a center of the substrate and a second position closer to a peripheral side of the substrate than the first position, and move the main nozzle between a discharge position above the substrate and a standby position; and a sub nozzle configured to eject the processing liquid from a third position closer to a peripheral side of the substrate than the first position. A flow rate of the processing liquid ejected from the sub nozzle is set to be higher than a flow rate of the processing liquid ejected from the main nozzle.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
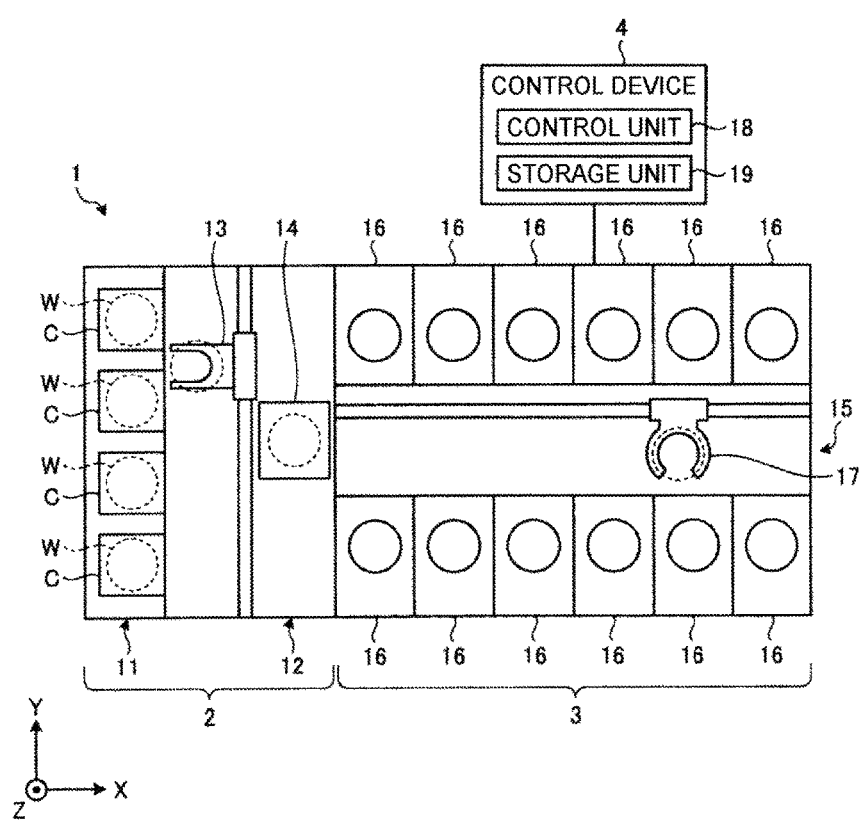
FIG. 1 is a plan view illustrating an outline of a substrate processing system provided with processing units according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

The present disclosure has been made in consideration of the problems in the related art and an object of the present disclosure is to provide a technique of performing a processing on a substrate with high in-plane uniformity by suppressing a temperature difference between a central side and a peripheral side of the substrate when a liquid processing is performed by supplying a processing liquid from a nozzle to the substrate while the substrate is rotating.

In an exemplary embodiment, liquid processing apparatus of the present disclosure includes a substrate holding unit configured to hold a substrate horizontally; a rotating mechanism configured to rotate the substrate holding unit around a vertical axis; a main nozzle configured to eject a processing liquid onto a surface of the substrate held in the substrate holding unit; a nozzle moving mechanism configured to reciprocate the main nozzle between a first position where the processing liquid ejected from the main nozzle reaches a center of the substrate and a second position closer to a peripheral side of the substrate than the first position, and move the main nozzle between a discharge position above the substrate and a standby position; and a sub nozzle configured to eject the processing liquid from a third position closer to a peripheral side of the substrate than the first position. A flow rate of the processing liquid ejected from the sub nozzle is set to be higher than a flow rate of the processing liquid ejected from the main nozzle.

The liquid processing apparatus may have the following configurations.

The third position is set at a position spaced an opening angle away from the ejection position of the processing liquid of the main nozzle on the substrate in which the opening angle ranges from 180° to 270° in a rotating direction when viewed from the center of the substrate.

A distance between the third position and the center of the substrate is the same as a distance between the second position and the center of the substrate.

A temperature difference between the maximum value and the minimum value within the substrate ranging from the central portion to the peripheral portion is equal to or lower than 1.5° C. An equation $[(Max-Min)/(Max+Min)/2] \times 100 \leq 5.0\%$ is satisfied, where Max is the maximum temperature of the substrate and MM is the minimum temperature of the substrate within a range from the central portion to the peripheral portion of the substrate.

The second position is positioned closer to the central side than a position approaching 45 mm from the periphery of the substrate to the central side thereof.

The first position is spaced away from a central position of the substrate.

In another exemplary embodiment, a liquid processing method of the present disclosure includes holding a substrate horizontally in a substrate holding unit; reciprocating a main nozzle between a first position where a processing liquid reaches a center of the substrate and a second position closer to a peripheral side of the substrate than the first position while ejecting the processing liquid onto a surface of the substrate from the main nozzle in a state where the substrate holding unit is rotated around a vertical axis; and when an ejection of the processing liquid is performed by the main nozzle, ejecting the processing liquid from a sub nozzle from a third position closer to the peripheral side of the substrate than the first position at an ejection flow rate higher than an ejection flow rate from the main nozzle, thereby adjusting an in-plane temperature distribution of the substrate by the processing liquid supplied from the main nozzle.

In the above-mentioned liquid processing method, the third position is set at a position an opening angle away from an ejection position of the processing liquid of the main nozzle on the substrate in which the opening angle ranging from 180° to 270° in a rotating direction when viewed from the center of the substrate.

In the above-mentioned liquid processing method, the first position is spaced away from a central position of the substrate.

According to still another exemplary embodiment, a storage medium of the present disclosure stores a computer program used in a liquid processing apparatus that performs a liquid processing by supplying a processing liquid to a substrate. The program includes steps organized to perform the above-mentioned liquid processing method.

According to the present disclosure, the temperature difference between the central side and the peripheral side of the substrate may be suppressed, and thus, a processing may be performed on a substrate with high in-plane uniformity.

FIG. 1 is a plan view illustrating an outline of a substrate processing system provided with a processing unit according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and a processing station 3 are provided adjacent to each other.

The carry-in/out station 2 is provided with a carrier placing section 11 and a transfer section 12. In the carrier placing section 11, a plurality of carriers C is placed to accommodate a plurality of substrates (semiconductor wafers in the present exemplary embodiment) (hereinafter, referred to as "wafers W") horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the liquid processing system 1 is provided with a control device 4. The control device 4 is, for example, a computer, and includes a control unit 18 and a storage unit 19. The storage unit 19 stores a program that controls various processings performed in the liquid processing system 1. The control unit 18 controls the operations of the liquid processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the transfer unit 14. The wafer W placed on the transfer unit 14 is taken out from the transfer unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

Figure 2:
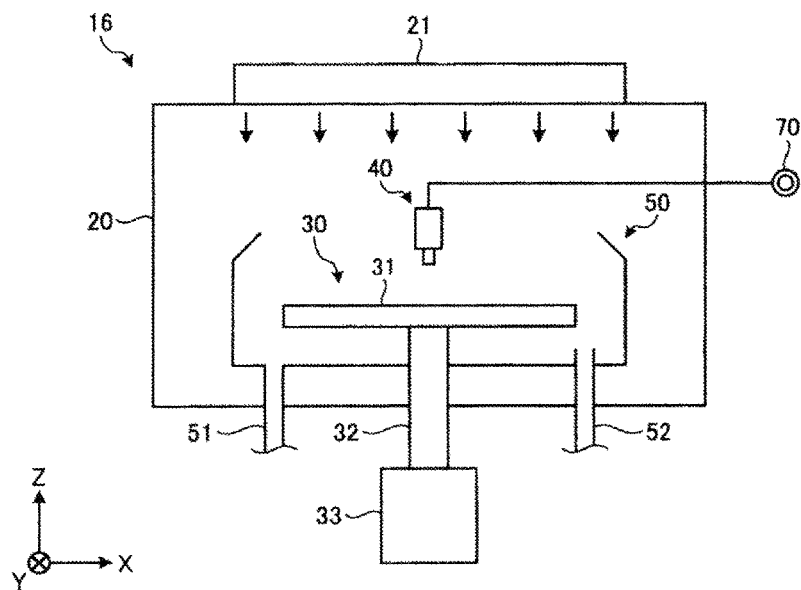
FIG. 2 is a vertical cross-sectional view illustrating an outline of the processing unit.

As illustrated in FIG. 2, the processing unit 16 is provided with a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on the ceiling of the chamber 20. The FFU 21 forms a downflow in the chamber 20.

The substrate holding mechanism 30 is provided with a holding unit 31, a support unit 32, and a driving unit 33. The holding unit 31 holds the wafer W horizontally. The support unit 32 is a vertically extending member, and has a base end portion supported rotatably by the driving unit 33 and a tip end portion supporting the holding unit 31 horizontally. The driving unit 33 rotates the support unit 32 around the vertical axis. The substrate holding mechanism 30 rotates the support unit 32 by using the driving unit 33, so that the holding unit 31 supported by the support unit 32 is rotated, and hence, the wafer W held in the holding unit 31 is rotated.

The processing fluid supply unit 40 supplies a processing fluid onto the wafer W. The processing fluid supply unit 40 is connected to a processing fluid source 70.

The recovery cup 50 is disposed to surround the holding unit 31, and collects the processing liquid scattered from the wafer W by the rotation of the holding unit 31. A drain port 51 is formed on the bottom of the recovery cup 50, and the processing liquid collected by the recovery cup 50 is discharged from the drain port 51 to the outside of the processing unit 16. Further, an exhaust port 52 is formed on the bottom of the recovery cup 50 to discharge a gas supplied from the FFU 21 to the outside.

The processing unit 16 as outlined above corresponds to the liquid processing apparatus of the present exemplary embodiment. The processing unit 16 is configured to perform a liquid processing using two kinds of nozzle units (corresponding to the processing fluid supply unit 40 as illustrated in FIG. 2) in order to suppress an in-plane temperature difference ($\Delta T$) between the maximum value and the minimum value of the wafer W to 1.5° C. or less, for example, 1° C. or less when the processing liquid is supplied onto the surface of the wafer W.

Hereinafter, descriptions will be made on an example of the processing unit 16 configured as an etching unit in which a separation of an undesirable metal and a removal of foreign substances are performed by supplying an organic etching liquid to a metal film formed on the surface of the wafer W, for example, in a wiring process of a semiconductor device, with reference to FIGS. 3 to 7.

Figure 3:
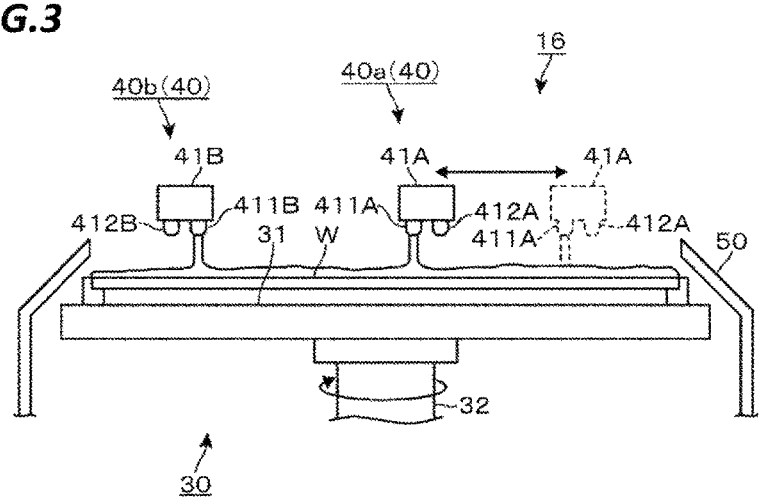
FIG. 3 is a view illustrating a region adjacent to a wafer held in a holding unit in an enlarged scale.

FIG. 3 is a view schematically illustrating a region adjacent to the wafer W held on the holding unit 31 of the processing unit 16 as illustrated in FIG. 2 in an enlarged scale. As illustrated in FIG. 3, the processing unit 16 is provided with a main nozzle unit 40a that supplies an etching liquid to a whole surface of the wafer W and a sub nozzle unit 40b that adjusts a temperature distribution formed in a plane of the wafer W by the etching liquid supplied from the main nozzle unit 40a.

Figure 6:
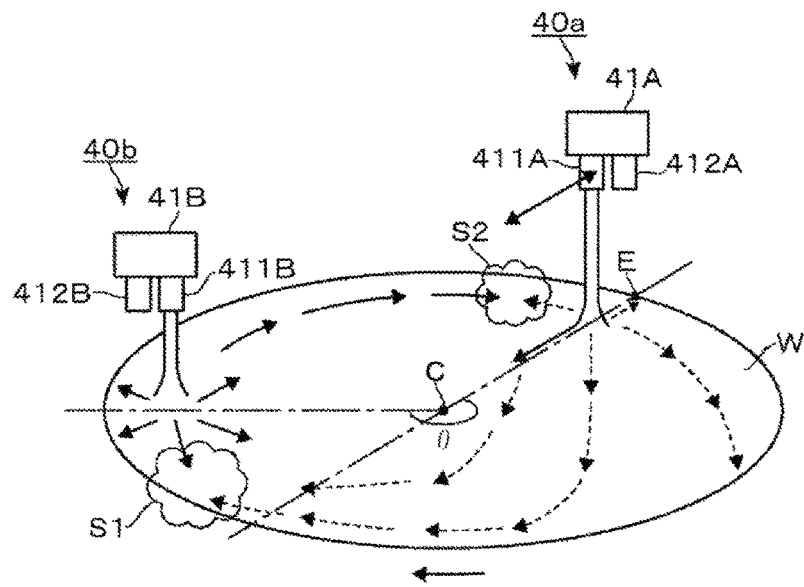
FIG. 6 is an explanatory view illustrating a flow of a processing liquid ejected from a main nozzle and a sub nozzle.

The main nozzle unit 40a has a configuration in which a common nozzle head 41A is provided with an etching nozzle 411A that supplies the etching liquid to the wafer W and a rinse nozzle 412A that supplies a rinse liquid such as deionized water (DIW). As illustrated in FIGS. 3 and 6, the nozzles 411A, 412A eject the respective processing liquids (the etching liquid and the rinse liquid) linearly towards a lower side.

Figure 4:
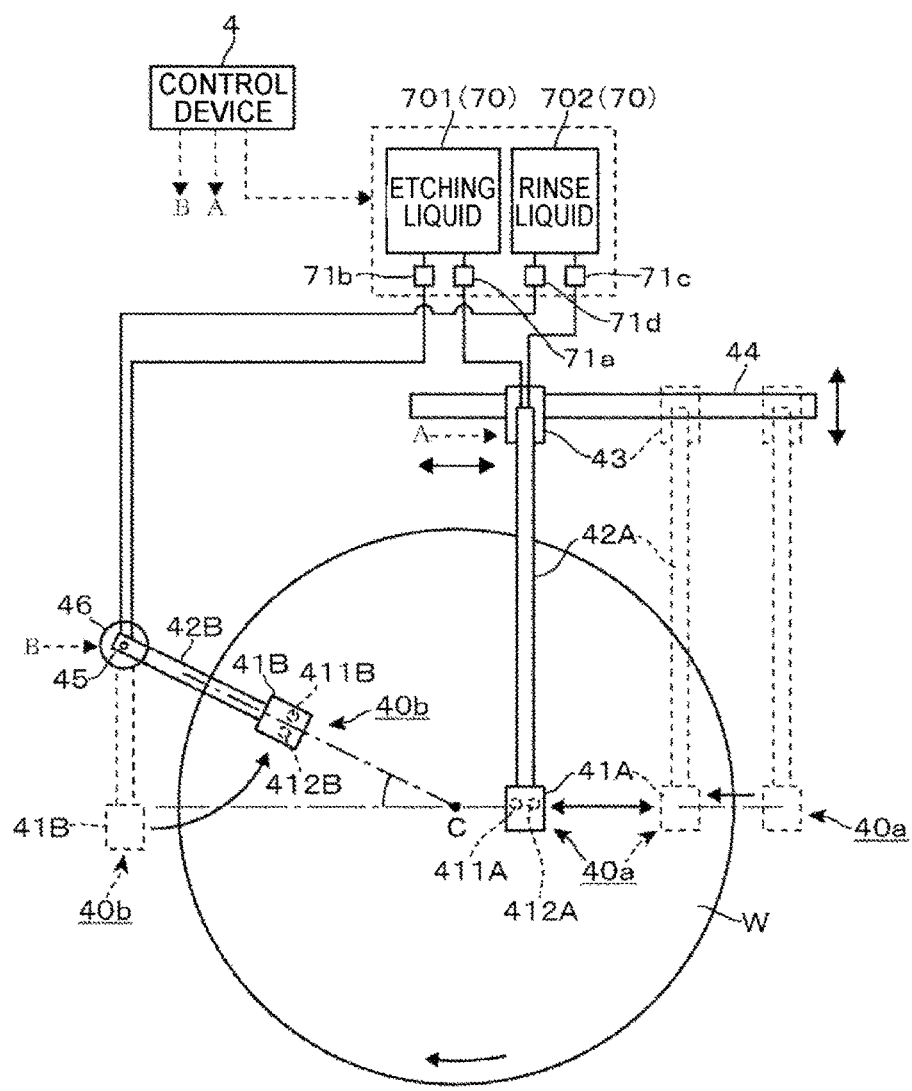
FIG. 4 is a plan view of the processing unit.
Figure 8:
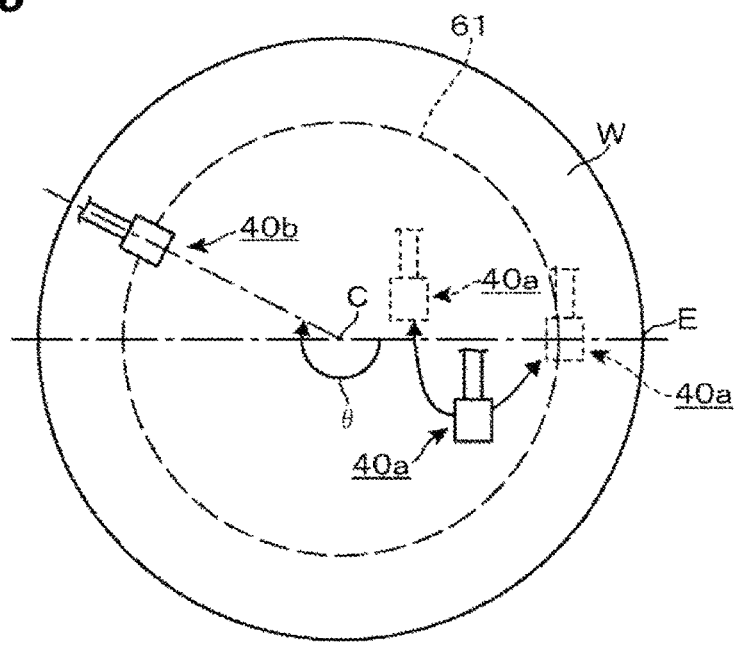
FIG. 8 is a plan view illustrating a relationship between a modified example of a moving path of the main nozzle and an arrangement position of the sub nozzle.

As illustrated in FIG. 4, the nozzle head 41A of the main nozzle unit 40a is provided at a front end of a nozzle arm 42A that extends along the wafer W held on the holding unit 31 and disposed above the top surface (a surface to be processed) of the wafer W. A base end of the nozzle arm 42A is supported by a slider 43 which can travel on a guide rail 44, and is able to move the main nozzle unit 40a freely transversely along the radial direction of the wafer W in a region from a central side to a peripheral side of the wafer W as the slider 43 moves on the guide rail 44. Further, the main nozzle unit 40a may also be moved to a standby position retreated from the upper side to a lateral side of the wafer W. The guide rail 44 or the slider 43, and the nozzle arm 42A or the nozzle head 41A correspond to a nozzle moving mechanism of the etching nozzle 411A provided in the main nozzle unit 40a. Meanwhile, as illustrated in FIG. 8 (to be described later), the guide rail 44 may be movable vertically to move the slider 43 in a curved form.

Similarly to the main nozzle unit 40a, the sub nozzle unit 40b has a configuration in which a common nozzle head 41B is provided with an etching nozzle 411B that supplies the etching liquid to the wafer W and a rinse nozzle 412B that supplies a rinse liquid.

The nozzle head 41B of the sub nozzle unit 40b is provided at a front end of a nozzle arm 42B that extends along the wafer W held in the holding unit 31 and disposed at the upper side of the wafer W. As illustrated in FIG. 4, a base end of the nozzle arm 42B is supported by a rotary shaft 45 which is rotatable by a driving unit 46, and is able to move between a preset processing position at the peripheral side of the wafer W (as indicated by solid lines in FIG. 4) and the standby position retreated from the upper side to a lateral side of the wafer W (as indicated by broken lines in FIG. 4). The driving unit 46, the nozzle arm 42B, and the nozzle head 41B correspond to a nozzle moving mechanism of the etching nozzle 411B provided in the sub nozzle unit 40b separately from the main nozzle unit 40a.

The etching nozzles 411A, 411B of the main nozzle unit 40a and the sub nozzle unit 40b are connected to an etching liquid source 701 (corresponding to the processing fluid source 70 as illustrated in FIG. 2) through the nozzle heads 41A, 41B or the nozzle arms 42A, 42B. The etching liquid source 701 is provided with a storing unit (not illustrated) that stores the etching liquid and a temperature adjusting unit (not illustrate), such as a heater, that adjusts a temperature of the etching liquid in the storing unit. The etching liquid source 701 may supply the etching liquid whose temperature is adjusted to 20° C. to 70° C., for example, 50° C., to each of the etching nozzles 411A, 411B. An outlet of the etching liquid source 701 is provided with flow rate adjusting units 71a, 71b that adjust flow rate of the etching liquid sent to each of the etching nozzles 411A, 411B.

Further, the rinse nozzles 412 of the main nozzle unit 40a and the sub nozzle unit 40b are connected to a rinse liquid source 702 (corresponding to the processing fluid source 70 as illustrated in FIG. 2) provided with a storing unit (not illustrated) that stores the rinse liquid. The rinse liquid source 702 may supply the rinse liquid whose flow rate is adjusted in flow rate adjusting units 71c, 71d.

The flow rate adjustment of the etching liquid or the rinse liquid, the temperature adjustment of the etching liquid, and the movement operation of the main nozzle unit 40a and the sub nozzle unit 40b are controlled by the above-mentioned control device 4.

The main nozzle unit 40a and the sub nozzle unit 40b having the configuration as described above may adjust the in-plane temperature distribution of the wafer W uniformly during the etching processing by ejecting the etching liquid from the etching nozzles 411A, 411B at different positions with respect to the wafer W. Hereinafter, descriptions will be made on a method of setting an ejection position of the etching liquid from each of the etching nozzles 411A, 411B in order to make the in-plane temperature distribution of the wafer W uniform, with reference to FIG. 5.

For convenience of descriptions, the ejection of the etching liquid from the etching nozzles 411A, 411B of the main nozzle unit 40a and the sub nozzle unit 40b will be also referred to as "an ejection of the etching liquid from the main nozzle unit 40a and the sub nozzle unit 40b" in the following descriptions.

Figure 5:
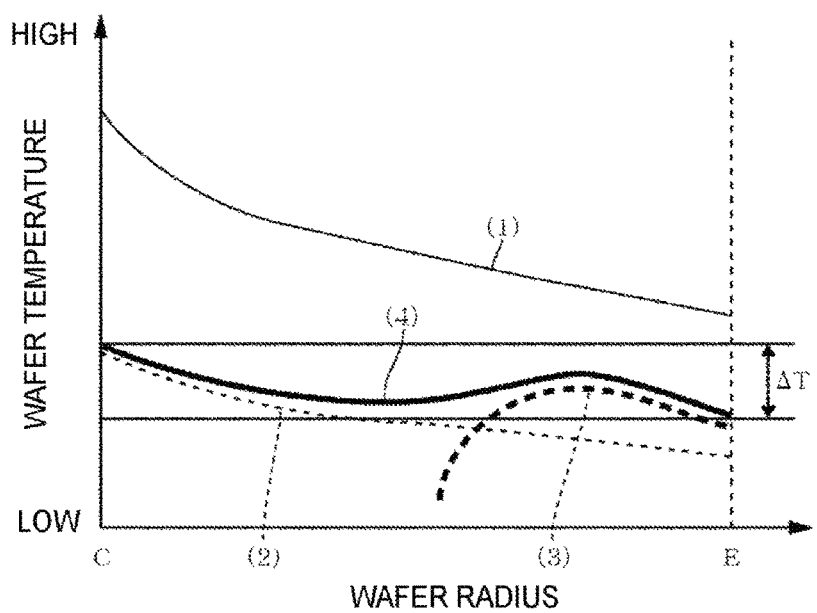
FIG. 5 is an explanatory view illustrating a change of an in-plane temperature distribution within a wafer surface due to a difference in an ejection position of an etching liquid.

FIG. 5 is an explanatory view illustrating a change of an in-plane temperature distribution of the wafer W when the ejection position of the etching liquid is changed. The horizontal axis of FIG. 5 represents a position in the radial direction of the surface of the wafer W ranging from a center C to a periphery E, and the vertical axis thereof represents a temperature of the wafer W at each position.

In FIG. 5, a curve numbered as (1) (as indicated by a thin solid line) represents an in-plane temperature distribution of the wafer W in a case where an etching liquid adjusted to a predetermined temperature (e.g., 50° C. in the example of the etching liquid source 701 in FIG. 4) is ejected from one etching nozzle 411A to a central region of the wafer W including the center C.

As shown in the in-plane temperature distribution of (1), in a case where the etching liquid is ejected to the central region of the wafer W, the temperature of the etching liquid is reduced as the etching liquid is spread on the wafer W while the wafer W is rotating. Therefore, the temperature of the wafer W is reduced from the central side to the peripheral side. If the temperature change is large, the in-plane result of the etching processing becomes non-uniform.

In order to improve the in-plane temperature distribution of (1) in which the temperature of the wafer W is reduced at the peripheral side, a method is suggested in which the etching nozzle 411A is moved in the peripheral direction from the center of the wafer W to supply the temperature-adjusted etching liquid directly to the peripheral region rather than the central region. However, in the state where the etching nozzle 411A is moved from the center of the wafer W, the etching liquid does not reach the central region of the wafer W uniformly. Therefore, the etching processing may not be performed on the central region.

Accordingly, in order to make the in-plane temperature distribution of the wafer W uniform while performing the etching processing on the central region of the wafer W, the etching liquid may be ejected while reciprocating the etching nozzle 411A between a position where the ejected etching liquid reaches the center of the wafer W (hereinafter, referred to as a 'first position') and a position closer to the peripheral side than the central side of the wafer W (hereinafter, referred to as a 'second position').

For example, it is assumed that a distance between the first position at the central side of the wafer W and the second position at the peripheral side is increased gradually from zero, and the in-plane temperature distribution is measured under various conditions. In this case, as the distance between the first position and the second position increases, the temperature at the central side of the wafer W decreases and the temperature difference between the central side and the peripheral side decreases so that a slope of the in-plane temperature becomes gentle.

However, although the distance between the first position and the second position further increases, a decrement of the temperature difference between the central side and the peripheral side decreases gradually. Eventually, the temperature of the central portion may be excessively reduced, resulting in an increased temperature difference. The in-plane temperature distribution in this state is illustrated by a curve numbered as (2) (thin dashed line) in FIG. 5.

As illustrated in FIG. 5, when the ejection position of the etching liquid from the etching nozzle 411A is moved between the first position at the central side and the second position at the peripheral side and these positions are set properly, the uniformity of the in-plane temperature distribution of the wafer W may be improved, as compared with a case where the etching liquid is supplied only to the central side. Meanwhile, in a case where a more uniform in-plane temperature distribution is required, other methods are necessary, in addition to reciprocating the etching nozzle 411A between the first position and the second position.

Therefore, in the processing unit 16 of the present exemplary embodiment, the in-plane temperature distribution of the wafer W is adjusted by providing the sub nozzle unit 40b provided with the etching nozzle 411B 9the sub nozzle) that ejects the etching liquid directly from a present position (the third position) closer to the peripheral side of the wafer W than the first position, in addition to the main nozzle unit 40a provided with the etching nozzle 411A (the main nozzle) that reciprocates between the first position and the second position.

The in-plane temperature distribution numbered as (3) in FIG. 5 (a indicated by a thick dashed line) represents an example of a case where the etching liquid is ejected only from the sub nozzle unit 40b from the predetermined position (the third position) rather than from the first position. When the etching liquid is supplied directly to the position at the peripheral side of the wafer W, the in-plane temperature distribution in a chevron form in which the temperature at a position where the etching liquid reaches the wafer W is highest and the temperatures at the central side and the peripheral side are lower than the reaching position, and spread in an annular form along the circumferential direction of the wafer W.

Therefore, when the sub nozzle unit 40b is provided such that the etching liquid is ejected towards a region where the temperature difference with the central side is increased in the in-plane temperature distribution of (2), the in-plane temperature distributions of (2) and (3) may be combined to form an in-plane temperature distribution numbered as (4) (as indicated by a thick solid line) which is uniformed such that the temperature difference between the maximum value and the minimum value of the wafer W becomes smaller.

Here, the position to which the etching liquid is ejected from the sub nozzle unit 40b is set to, for example, a position which allows the temperature difference ($\Delta T$) between the maximum value and the minimum value of the wafer W to be a preset target temperature difference, for example, a value of 1° C. or less.

Further, considering the in-plane uniformity of the temperature of the wafer W, the ejection position may be set to a position satisfying the following equation which is an index representing the in-plane uniformity of the temperature:

$$[(Max-Min)/(Max+Min)/2]\times 100 \leq 2.0\%$$

where Max is the maximum temperature of the wafer W and MM is the minimum temperature of the wafer W within a range from the central portion to the peripheral portion of the wafer W.

For the ejection position of the etching liquid which realizes the above-mentioned target temperature difference or target in-plane uniformity, a search of the position which realizes the above-mentioned target value may be carried out, for example, by performing a test in which the etching liquid is ejected from the main nozzle unit 40a and the sub nozzle unit 40b and an actual temperature of the wafer W is measured, and at this time, gradually moving the ejection position of the sub nozzle unit 40b from the first position towards the peripheral side. Further, the ejection position of the etching liquid from the sub nozzle unit 40b, which realizes the target value, may be determined by a simulation using fluid analysis software.

Even in a case where a strict search of the ejection position of the etching liquid is not carried out in this manner, if the etching liquid is ejected towards a region closer to the peripheral side than the central position between the center C and the periphery E of the wafer W, at least the in-plane temperature difference (ΔT) between the maximum value and the minimum value of the wafer W may be reduced, as compared with a case where an ejection to the region is not done.

Here, in each processing related to the in-plane temperature distributions of (1) and (4) in FIG. 5, the temperatures of processing liquids supplied in the processings coincide such that the heat amount supplied to the wafer W is consistent. Further, it is assumed that an ejection flow rate F1 of an etching liquid ejected towards the central region of the wafer W and a total ejection flow rate F2 of ejection liquids from the main nozzle unit 40a and the sub nozzle unit 40b coincide with each other (F1=F2) in a processing related to (1). Accordingly, in a case where the etching liquid is ejected from the main nozzle unit 40a at the same flow rate F1 as in the processing related to (1), the in-plane temperature distribution of the wafer W generally moves to a higher temperature side, as compared with a case of the in-plane distribution of (2).

Next, descriptions will be made on a relationship of the ejection flow rate of the etching liquid between the main nozzle unit 40a and the sub nozzle unit 40b. For example, it is assumed that the sub nozzle unit 40b is disposed at a predetermined ejection position, a sum (f1+f2=F2) of an ejection flow rate f1 from the main nozzle unit 40a and an ejection flow rate f2 from the sub nozzle unit 40b is set to be constant, and then, the ejection flow rate of the main nozzle unit 40b is increased gradually from a state of f2=0.

In a case where the etching liquid is not ejected from the sub nozzle unit 40b, an action to adjust the in-plane temperature distribution is not exhibited. Then, when the ejection flow rate from the sub nozzle unit 40b is increased, the effect to adjust the in-plane temperature distribution by the sub nozzle unit 40b increases in combination with the action to reduce the ejection flow rate from the main nozzle unit 40a. Further, when the ejection flow rate of the sub nozzle unit 40b is increased to be higher than the ejection flow rate of the main nozzle unit 40a (f2>f1), the processing liquid from the sub nozzle unit 40b has a relatively strong influence on the in-plane temperature distribution. Therefore, the temperature at the peripheral side of the wafer W greatly increases. As a result, as shown in (4) of FIG. 5, a smaller in-plane temperature distribution than the temperature difference (ΔT) between the maximum value and the minimum value of the wafer W may be realized. Accordingly, in the present exemplary embodiment, the relationship between the ejection flow rates of the etching liquids from the main nozzle unit 40a and the sub nozzle units 40b is selected such that the ejection flow rate of the sub nozzle unit 40b is higher than the ejection flow rate of the main nozzle unit 40b, and the above-mentioned target temperature difference or target in-plane uniformity is realized.

As described above, since the etching liquid is ejected using the main nozzle unit 40a that reciprocates between the first position and the second position, and the sub nozzle unit 40b disposed at a predetermined position (the third position), the etching processing may be performed in a state where the in-plane temperature distribution is more uniform, thereby contributing to enhancement of the in-plane uniformity of the etching processing.

Meanwhile, when the etching liquid is ejected to the wafer W using a plurality of etching nozzles 411A, 411B, the flow of the etching liquid may collide with each other on the surface of the wafer W so that splash occurs and causes splashed mist to contaminate the wafer W.

For example, in FIG. 6, the flow of the etching liquid ejected onto the surface of the wafer W from the main nozzle unit 40a is indicated by a dashed line, and the flow of the etching liquid ejected onto the surface of the wafer W from the sub nozzle unit 40b is indicated by a solid line. In the main nozzle unit 40a that reciprocates between the first position at the central side of the wafer W and the second position at the peripheral side of the wafer W, the thickness of the etching liquid increases with the flow of the etching liquid supplied when the main nozzle unit 40a moves to the peripheral side, as compared with a case where the etching liquid is supplied from the central side. Further, the centrifugal force applied to the etching liquid is larger at the peripheral side than at the central side. Accordingly, large splash is likely to occur at the positions (denoted as S1, S2 in FIG. 6) where the flow of the etching liquid that is thickened and affected by the large centrifugal force joins the flow of the etching liquid supplied from the sub nozzle unit 40b.

In the processing unit 16 of the present exemplary embodiment, the arrangement of the nozzle units 40a, 40b is set such that the sub nozzle unit 40b is arranged at as far a position as possible from the main nozzle unit 40a in the downstream of the rotating direction of the wafer W with respect to the flow of the etching liquid supplied from the main nozzle unit 40a that moves to the peripheral side, when viewed from the circumferential direction of the wafer W. That is, the ejection position of the sub nozzle unit 40b providing the etching liquid to the wafer W is set at a position spaced an opening angel away from the ejection position on the substrate, to which the etching liquid is ejected from the main nozzle unit 40a, in which the opening angle ranges from 180° to 270° in the rotating direction when viewed from the center of the wafer W. Meanwhile, in the present exemplary embodiment, the distance of the position of the sub nozzle unit 40b (the third position) from the center of the substrate is the same as the distance of the second position from the center of the substrate.

Figure 7:
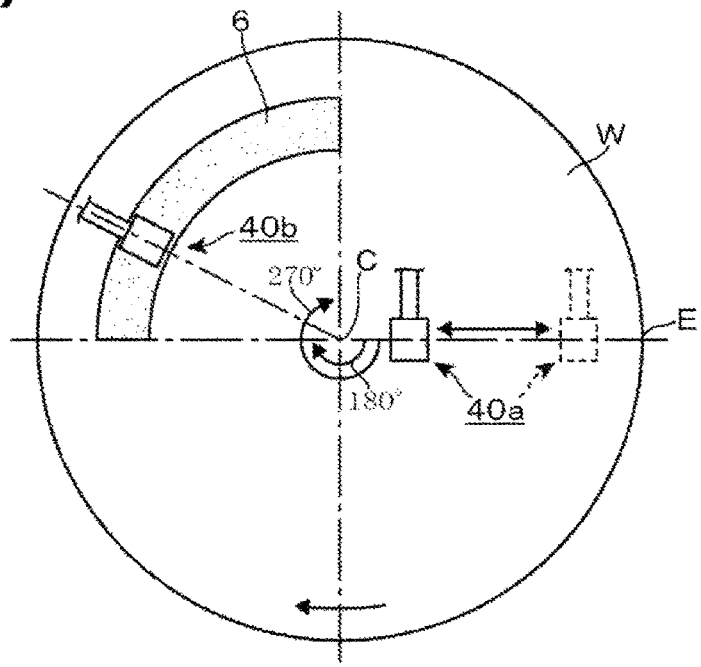
FIG. 7 is a plan view illustrating a relationship between a movement range of the main nozzle and an arrangement position of the sub nozzle.

FIG. 7 illustrates a settable range of the ejection position of the sub nozzle unit. Since the flow of the etching liquid supplied from the main nozzle unit 40a that reciprocates has a large energy in some cases, the opening angle is preferably 185° to 270°. When the opening angle is larger than 270°, the sub nozzle unit 40b comes close to the main nozzle unit 40a that moves to the outer peripheral side. Therefore, splash may increase at the position S2.

The generation of splash is also affected by the set position of the second position in the main nozzle unit 40a that reciprocates. That is, it is experimentally confirmed that, as the set position of the second position is moved towards the peripheral side of the wafer W, the splash becomes larger (see Test 2 to be described later). Meanwhile, as the second position comes closer to the central side of the wafer W, the in-plane temperature distribution of (2) comes closer to the in-plane temperature distribution of (1). Therefore, the temperature difference (ΔT) between the highest temperature and the lowest temperature in the in-plane temperature distribution of (4) increases.

In order to suppress the generation of splash, the second position of the main nozzle unit 40a may be moved to the central side within a range satisfying the above-mentioned target temperature difference or target in-plane uniformity. As seen in a test result to be described later (Test 2), the second position is preferably set to be positioned closer to the central side than a position approaching 45 mm from the periphery of the wafer W to the central side thereof from the viewpoint of reducing splash. Further, the distance of the position of the sub nozzle unit 40b (the third position) from the center of the substrate is not limited to the same distance from the second position, but may be appropriately adjusted, for example, to be positioned closer to the peripheral side in order to further reduce the affection of the splash.

Actions of the processing unit 16 configured as described above will be described. A wafer W transferred to each processing unit 16 by the substrate transfer device 17 is carried into the chamber 20 through the carry-in/out port (not illustrated). The substrate holding mechanism 30 (the substrate holding unit) delivers a processing target wafer W from the wafer holding mechanism of the substrate transfer device 17 onto the holding surface 311 of the holding unit 31 through elevation pins (not illustrated), and then, retreated from the inside of the chamber 20.

When the wafer W is placed on the holding unit 31, the holding unit 31 is rotated by the driving unit 33 (a rotation mechanism), the main nozzle unit 40a is moved from the standby position to the first position, and the sub nozzle unit 40b is moved from the standby position to a preset ejection position.

Then, when the rotation speed reaches a predetermined set speed, the ejection of the etching liquid from the main nozzle unit 40a and sub nozzle unit 40b is started, and the main nozzle unit 40a is reciprocated. The movement speed of the main nozzle unit 40a is set to move between the first position and the second position, for example, several times to dozens of times for one minute.

As a result, the etching liquid ejected from the nozzle units 40a, 40b is spread on the surface of the rotating wafer W as illustrated in FIG. 6, so that the etching processing of the wafer W is performed. At this time, while the etching liquid is supplied using the main nozzle unit 40a that reciprocates between the central side and the peripheral side of the wafer W and the sub nozzle unit 40b for adjusting the in-plane temperature distribution, the etching processing is performed with a uniform in-plane temperature distribution as illustrated in (4) of FIG. 5. Further, the generation of splash may be suppressed by setting the opening angle between the ejection positions of the main nozzle unit 40a and the sub nozzle unit 40b in the range of 180° to 270° as illustrated in FIGS. 6 and 7, and setting the second position, which defines the reciprocating range of the main nozzle unit 40a, to be positioned closer to the central side than a position approaching 45 mm from the periphery of the wafer W to the central side thereof. Accordingly, the wafer W may be suppressed from being contaminated.

When the etching processing is performed for a predetermined time in this manner, the ejection of the etching liquid from the main nozzle unit 40a and the sub nozzle unit 40b is stopped, and a rinse liquid is ejected from the rinse nozzles 412A, 412B of the nozzles 40a, 40b. Here, in a case where the in-plane temperature distribution of the wafer W influences the result of the etching processing during a rinse cleaning with the rinse liquid such as a hot rinse processing, the rinse liquid is supplied using both of the main nozzle unit 40a that reciprocates between the first position and the second position and the sub nozzle unit 40b for adjusting the in-plane temperature distribution, similarly to the supply of the etching liquid. At this time, the same examination as the example described with FIG. 5 may be performed to set the first position or the second position of the main nozzle unit 40a and the ejection position of the sub nozzle unit 40b to be different from those during the ejection of the etching liquid.

Further, in a case where the in-plane temperature distribution of the wafer W has small influence on the result of the etching processing during a rinse cleaning, for example, the main nozzle unit 40a may be stopped above the central portion of the wafer W, the rinse liquid may be supplied only from the main nozzle unit 40a, and the adjustment of the in-plane temperature distribution by the sub nozzle unit 40b may not be performed.

When the rinse cleaning is performed in this manner and a shake-off drying is performed, the rotation of the holding unit 31 is stopped. Then, the wafer W is carried out of the processing unit 16 by transferring the wafer W to the wafer holding mechanism that enters the chamber 20, in an opposite order of the carry-in.

According to the processing unit of the present exemplary embodiment, there are the following effects. The etching liquid is ejected to a substrate that is rotating while moving the etching nozzle 411A (the main nozzle) of the main nozzle unit 40a between a position where the etching liquid reaches the center of the wafer W and a position closer to the peripheral side than the position, and in order to suppress reduction of the temperature at the peripheral side of the wafer W, the etching liquid is ejected from the etching nozzle 411B (the sub nozzle) of the sub nozzle unit 40b at an ejection flow rate higher than that from the main nozzle unit 40a. Therefore, since the reduction of the temperature difference between the central side and the peripheral side of the wafer W is suppressed, the processing may be performed on the wafer W with high in-plane uniformity.

Here, a movement path of the main nozzle unit 40a that reciprocates between the first position at the central side of the wafer W and the second position at the outer peripheral side is not limited to a case of moving linearly towards the radial direction of the wafer W. For example, as illustrated in FIG. 8, the main nozzle unit 40a may be moved so as to draw a curved trajectory that protrudes from the first position at the central side to the rotating direction of the wafer W, and then, returns to the second position closer to the peripheral side than the first position. In this case, the opening angle of the ejection position of the main nozzle unit 40a and the ejection position of the sub nozzle unit 40b may be 180° to 270°, based on a time point when the main nozzle unit 40a moves on a circle 61 concentric with the wafer W passing through a position where the sub nozzle unit 40*b* is disposed as illustrated in FIG. 8.

Further, the position of the sub nozzle 411B provided for adjusting the in-plane temperature distribution of the wafer W (the third position) is not limited to a fixed position similar to that of the sub nozzle unit 40*b*. For example, during the ejection of the etching liquid, the sub nozzle 411B may be moved from the central side towards the peripheral side, or from the peripheral side towards the central side in a region closer to the peripheral side than the first position, or may be reciprocated between these regions.

In addition, the position where the sub nozzle 411B is disposed (the third position) is not limited to an upper side of the wafer W. For example, the processing liquid may be supplied to a preset position on the wafer W by disposing the sub nozzle 411B at a lateral side of the wafer W held in the holding unit 31 and ejecting the processing liquid obliquely downward towards the direction where the wafer W is disposed.

Further, the kind of the processing liquid capable of adjusting the in-plane temperature distribution of the wafer using the main nozzle 411A and the sub nozzle 411B of the present exemplary embodiment is not limited to the etching liquid. The processing liquid may be a resist liquid supplied to the wafer W in a coating and developing apparatus, a thinner for spreading the resist liquid on the surface of the wafer W, a raw material liquid for an antireflective film, or a developer supplied to a resist film after development. Further, the present disclosure may be applied to a supply of various processing liquids such as, for example, an acidic or alkaline chemical liquid supplied in a cleaning apparatus which performs a cleaning processing on the wafer W, and a plating liquid supplied in a plating apparatus which forms a metal film on the wafer W. In these cases, various processing liquids may be supplied at a temperature higher than that of the wafer W when supplying the processing liquids, or may be supplied at a temperature lower than that of the wafer W. In any case, the in-plane temperature distribution of the wafer W may also be adjusted by providing the sub nozzle 411B.

In addition, the kind of the substrate which may be processed using the processing unit (the liquid processing apparatus) of the present exemplary embodiment is not limited to a semiconductor wafer. For example, the present disclosure may be applied to a processing unit which performs a liquid processing on a glass substrate for a flat panel display.

EXAMPLE

Test 1

An in-plane temperature distribution of a surface of a wafer W was measured by supplying DIW serving as a processing liquid for simulation to the surface of the wafer W that is rotating, while changing an ejection method.

A. Test Condition

Example 1

A wafer W having a diameter of 300 mm was rotated at a rotational speed of 150 rpm, and a processing liquid whose temperature was adjusted to 50° C. was supplied thereto from the main nozzle unit 40*a* and the sub nozzle unit 40*b* as illustrated in FIGS. 3 and 4. A total ejection flow rate of the processing liquid was set to F2=1.5 L/min (an ejection flow rate from the main nozzle unit 40*a* was f1=0.6 L/min, and an ejection flow rate from the sub nozzle unit 40*b* was f2=0.9 L/min) A movement range of the main nozzle unit 40*a* was set to be from a position at an outer peripheral side spaced 30 mm away from the center of the wafer W (a first position) to a position at an outer peripheral side spaced 120 mm away therefrom. An arrangement position of the sub nozzle unit 40*b* was set to a position at an outer peripheral side spaced 90 mm away from the center of the wafer W. Even if the first position is set to a position spaced 30 mm away from a central position of the wafer W (a position above a central position of the wafer W) in a radial direction of the wafer W, the processing liquid may reach the center of the substrate with the above-mentioned ejection flow rate. Compared to a case where the first position is set to 0 mm (central position), the processing liquid may be supplied to the central position at the flow rate equivalent to those at other positions. Thus, it is desirable from the viewpoint of the in-plane uniformity. The movement speed of the main nozzle unit 40*a* was 150 mm/sec, and the ejection of the processing liquid was performed for 2 minutes. For the sake of simplicity, the expression that the first position or the second position is "a position at an outer peripheral side spaced X mm away from the center of the wafer W" will be described simply as "X mm" in the following descriptions.

Comparative Example 1-1

A test was performed under the same conditions as those in Example 1, except that the processing liquid was ejected at an ejection flow rate of 1.5 L/min only using the etching nozzle 411A fixed above the central portion of the wafer W.

Comparative Example 1-2

A test was performed under the same conditions as those in Example 1, except that the processing liquid was ejected at an ejection flow rate of 1.5 L/min only using the main nozzle unit 40*a* that reciprocates between the first position and the second position.

B. Test Result

Figure 9:
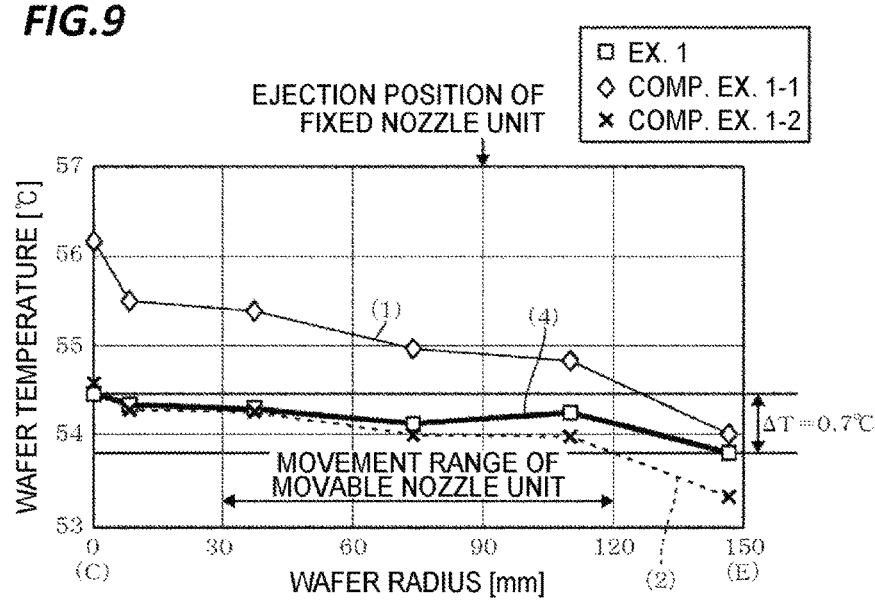
FIG. 9 is an explanatory view illustrating a relationship between an ejecting method of the etching liquid and a temperature distribution of a wafer.

The results of Example 1 and Comparative Examples 1-1 and 1-2 are represented in FIG. 9. The horizontal axis of FIG. 9 represents a position in the radial direction from the center C of the wafer W, and the vertical axis represents a temperature of the wafer W at each measurement position. The results of Example 1 were denoted by square plots, and the respective plots were connected with thick lines (corresponding to the in-plane temperature distribution (4) in FIG. 5). The results of Comparative Example 1-1 were denoted by diamond plots, and the respective plots were connected with thin lines (corresponding to the in-plane temperature distribution (1) in FIG. 5). Further, the results of Comparative Example 1-2 were denoted by cross plots, and the respective plots were connected with thin dashed lines (corresponding to the in-plane temperature distribution (2) in FIG. 5).

According to the results of Example 1, the in-plane temperature difference (ΔT) between the maximum value (Max=54.5° C.) and the minimum value (Min=53.8° C.) of the wafer W was 0.7° C. Further, the in-plane uniformity of the temperature distribution was 1.3%. In contrast, in Comparative Example 1-1 in which the processing liquid was supplied only from the central portion, the temperature at the central side was increased considerably as compared with Example 1, the temperature difference (ΔT) was 2.2° C., which was the highest, and the in-plane uniformity was 4.0%. Meanwhile, in Comparative Example 1-2 in which the processing liquid was supplied only using the main nozzle unit 40a, the temperature at the peripheral side was decreased as compared with Example 1, the temperature difference (ΔT) was increased to 2.2° C., and the in-plane uniformity was 2.2%.

From the test results, it is found that a more uniform in-plane temperature distribution may be realized by ejecting the processing liquid using a combination of the main nozzle unit 40a that reciprocates and the sub nozzle unit 40b for adjusting the in-plane temperature distribution.

Test 2

The same test as that in Example 1 was performed by varying the second position of the main nozzle unit 40a, and generation status of splash was investigated.

A. Test Condition

Example 2-1

The processing liquid was ejected under the same conditions as those in Example 1, except that the second position of the main nozzle unit 40a was set to 60 mm. The opening angle of the sub nozzle unit 40b with respect to the main nozzle unit 40a was 210°. The surface of the wafer at this time was photographed, and the generation status of splash was observed.

Example 2-2

The generation status of splash was observed under the same conditions as those in Example 2-1, except that the second position of the main nozzle unit 40a was set to 75 mm. Further, the in-plane temperature distribution of the wafer W was measured under the same conditions as those in Example 2-1, except that the first position of the main nozzle unit 40a was set to 15 mm, and the second position thereof was set to 75 mm.

Example 2-3

The generation status of splash was observed under the same conditions as those in Example 2-1, except that the second position of the main nozzle unit 40a was set to 90 mm. Further, the in-plane temperature distribution of the wafer W was measured under the same conditions as those in Example 2-1, except that the first position of the main nozzle unit 40a was set to 15 mm, and the second position thereof was set to 90 mm.

Example 2-4

The generation status of splash was observed under the same conditions as those in Example 2-1, except that the second position of the main nozzle unit 40a was set to 105 mm.

Example 2-5

The generation status of splash was observed under the same conditions as those in Example 2-1. Further, the in-plane temperature distribution of the wafer W was measured under the same conditions as those in Example 2-1, except that the first position of the main nozzle unit 40a was set to 15 mm.

B. Experiment Result

Figure 10:
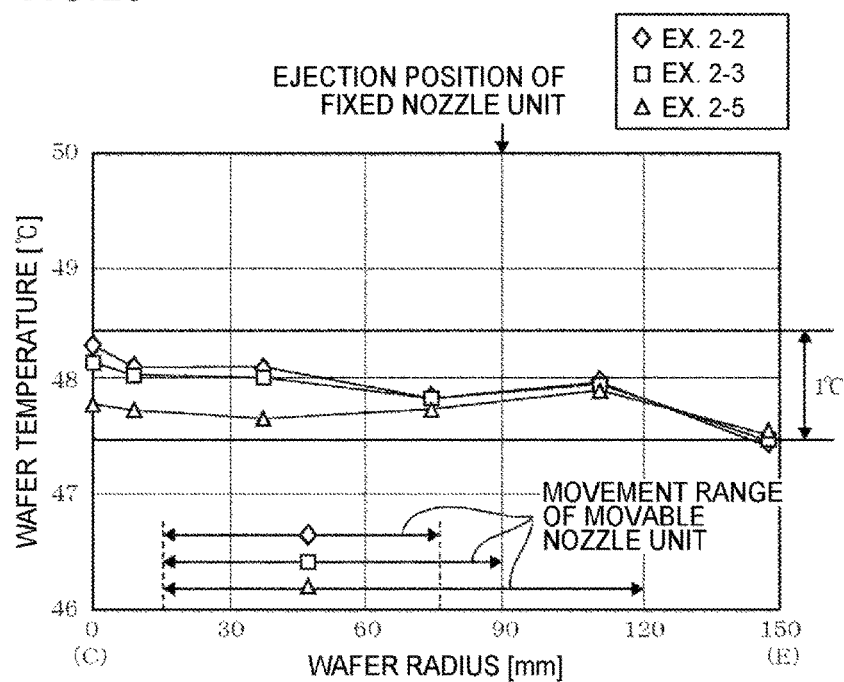
FIG. 10 is an explanatory view illustrating a relationship between the movement range of the main nozzle and the temperature distribution of the wafer.

The evaluation of the generation status of splash in Examples 2-1 to 2-5 is shown in Table 1. The in-plane temperature distribution of the wafer W in Examples 2-2, 2-3 and 2-5 is shown in FIG. 10. The horizontal axis and the vertical axis in FIG. 10 are the same as those in FIG. 9. The results of Example 2-2 were denoted by diamond plots, the results of Example 2-3 were indicated by square plots, and the results of Example 2-5 was indicated by triangle plots.

TABLE 1

|  | Movement range of main nozzle unit | Splash evaluation |
| --- | --- | --- |
| Example 2-1 | 30 mm-60 mm | none |
| Example 2-2 | 30 mm-75 mm | none |
| Example 2-3 | 30 mm-90 mm | none |
| Example 2-4 | 30 mm-105 mm | slightly generated |
| Example 2-5 | 30 mm-120 mm | generated |

According to the observation result of splash represented in Table 1, no splash was observed in Examples 2-1 to 2-3 in which the second position of the main nozzle unit 40a was less than 90 mm, that is, approached 60 mm or more from the peripheral side to the central side. Further, slight splash was confirmed in Example 2-4 in which the second position was 105 mm (approached 45 mm from the peripheral side to the central side). And, relatively large splash was generated in Example 2-5 in which the second position was 120 mm (approached 30 mm from the peripheral side to the central side).

Meanwhile, according to the in-plane temperature distribution of the wafer W as illustrated in FIG. 10, the temperature at the central side of the wafer W was slightly increased in Examples 2-2 and 2-3 in which the second position was moved towards the central side of the wafer W, as compared with Example 2-5 in which the test was performed under the substantially same conditions as those in Example 1. However, in any of Examples 2-2, 2-3 and 2-5, the value of the temperature difference (ΔT) was adjusted within 1° C. and the in-plane temperature distribution formed was good.

According to the test results in Table 1 and FIG. 10, it is found that there are conditions that are able to adjust the maximum in-plane temperature difference (ΔT) of the wafer W within 1° C., even if the second position is moved 120 mm to the inner side. Further, when it is desired to suppress generation of splash while maintaining the in-plane temperature distribution of the wafer W uniformly, the second position may be set to a position that is less than 105 mm, that is, a position approaching 45 mm or more from the peripheral side of the wafer W to the central side thereof within a range in which the in-plane temperature distribution satisfies the target value.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:
1. A liquid processing apparatus comprising:
a substrate holding table configured to hold a substrate horizontally;
a driving unit connected to the substrate holding table to rotatably support the substrate holding table and configured to rotate the substrate holding table around a vertical axis;

a main nozzle configured to eject a processing liquid onto a surface of the substrate held in the substrate holding table;

a nozzle moving mechanism including a guide rail and a slider, and configured to reciprocate the main nozzle between a first ejection position where the processing liquid ejected from the main nozzle reaches a center of the substrate and a second ejection position closer to a peripheral side of the substrate than the first ejection position, and move the main nozzle among the first ejection position, the second ejection position, and a standby position;

a sub nozzle configured to eject the processing liquid to a third ejection position closer to a peripheral side of the substrate than the first ejection position, the third ejection position being spaced at an angle of 180° to 270° in a rotating direction of the substrate from the second ejection position of the main nozzle above the substrate; and a control device configured to control a flow rate of the processing liquid ejected from the main nozzle and the sub nozzle such that the flow rate of the processing liquid ejected from the sub nozzle is set to be higher than the flow rate of the processing liquid ejected from the main nozzle, wherein the control device is configured to control the main nozzle and the sub nozzle such that the main nozzle ejects the processing liquid onto the surface of the substrate while reciprocating between the first ejection position and the second ejection position, and the sub nozzle ejects the processing liquid onto the surface of the substrate while being fixed at the third ejection position, and wherein the processing liquid ejected by the main nozzle and the processing liquid ejected by the sub nozzle are the same processing liquid supplied from one processing liquid source.

2. The liquid processing apparatus of claim 1, wherein a distance between the third ejection position and the center of the substrate is the same as a distance between the second ejection position and the center of the substrate.

3. The liquid processing apparatus of claim 1, wherein a temperature difference between the maximum value and the minimum value within the substrate ranging from the central portion to the peripheral portion is equal to or lower than 1.5° C.

4. The liquid processing apparatus of claim 1, wherein an equation $[(Max-Min)/(Max+Min)/2]\times 100 < 5.0\%$ is satisfied, where Max is the maximum temperature of the substrate and Min is the minimum temperature of the substrate within a range from the central portion to the peripheral portion of the substrate.

5. The liquid processing apparatus of claim 1, wherein the second ejection position is positioned closer to the central side than a position approaching 45 mm from the periphery of the substrate to the central side thereof.

6. The liquid processing apparatus of claim 1, wherein the first ejection position is spaced away from a central position of the substrate.

7. The liquid processing apparatus of claim 1, wherein the nozzle moving mechanism includes:

a nozzle arm provided with the main nozzle at one end thereof;

wherein the guide rail is extended in a straight line, and the slider is configured to support the other end of the nozzle arm and travel on the guide rail to move the main nozzle transversely along a radial direction of the substrate.

8. The liquid processing apparatus of claim 1, wherein the main nozzle and the sub nozzle are configured to eject the same processing liquid when the substrate is rotated in one rotation direction.

9. The liquid processing apparatus of claim 1, wherein the main nozzle and the sub nozzle are configured to eject the processing liquid in the same direction.

10. The liquid processing apparatus of claim 1, wherein the first ejection position is positioned at an outer peripheral side spaced about 30 mm away from the center of the substrate, and the second ejection position is positioned at the outer peripheral side spaced about 105 mm away from the center of the substrate.

11. The liquid processing apparatus of claim 1, wherein the control device is further configured to control the main nozzle such that the main nozzle ejects the processing liquid onto the surface of the substrate while reciprocating between the first ejection position and the second ejection position at a speed of about 150 mm/sec.

* * * * *